Figure 1:
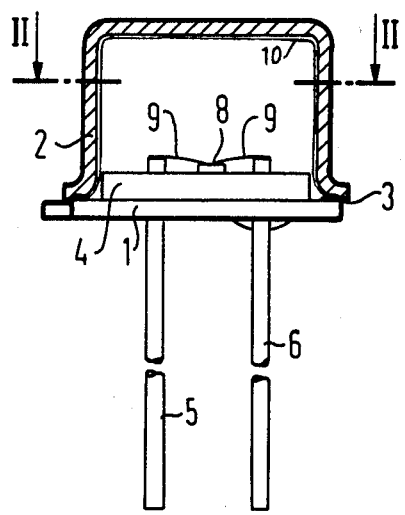

United States Patent [19]

Dathe et al.

[11] 4,345,108

[45] Aug. 17, 1982

[54] CASE FOR A SEMICONDUCTOR COMPONENT

[75] Inventors: Joachim Dathe, Munich; Erich Schmidhuber, Regensburg, both of Fed. Rep. of Germany

[73] Assignee: Siemens Aktiengesellschaft, Berlin and Munich, Fed. Rep. of Germany

[21] Appl. No.: 149,341

[22] Filed: May 13, 1980

[30] Foreign Application Priority Data

May 14, 1979 [DE] Fed. Rep. of Germany ....... 2919404

[51] Int. Cl.³ .............................................. H05K 5/04
[52] U.S. Cl. .................................. 174/52 H; 75/159; 75/178 C; 357/74
[58] Field of Search ............... 174/52 H, 52 S, 52 FP; 357/74; 75/159, 178 C

[56] References Cited

U.S. PATENT DOCUMENTS

| 2,236,452 | 3/1941 | Rogers | 75/159 X |
| 2,261,975 | 11/1941 | Crampton et al. | 75/159 X |
| 2,777,767 | 1/1957 | Leston | 75/159 X |
| 3,265,942 | 8/1966 | Osborne | 174/52 H X |

Primary Examiner—B. A. Reynolds
Assistant Examiner—David A. Tone
Attorney, Agent, or Firm—Herbert L. Lerner; Laurence A. Greenberg

[57] ABSTRACT

Case for a semiconductor component, including at least two parts, one of the parts being a cap, at least the cap being formed of a material having low hydrogen permeability and a weak catalytic effect for an oxyhydrogen gas reaction.

2 Claims, 2 Drawing Figures

CASE FOR A SEMICONDUCTOR COMPONENT

The invention relates to a case for a semiconductor component preferably comprising a bottom plate and a cap.

In the interior of metal cases for semiconductor components, water can be produced through an oxyhydrogen gas reaction during storage at an elevated temperature in air, due to diffusion of hydrogen and catalysis with oxygen which is present in the interior in free or bound form. The water, however, has a negative influence on electrical properties and the quality of the semiconductor component contained in the case, so that a certain maximum value of moisture in the interior of the case should not be exceeded.

Therefore, the oxygen content in the ambient atmosphere is reduced at high cost to concentrations as low as possible when cases for semiconductor components are sealed. In addition, this requires continuous monitoring. The inside walls of the cases must furthermore be made free of oxide by an appropriate pre-treatment. This applies particularly to nickel, which has been used as a material for cases in the past and has a high permeability for hydrogen, and is furthermore a good catalyst.

In spite of such pre-treatments, a small residual oxygen content, and therefore a corresponding amount of water after the catalysis with diffused-in hydrogen, are unavoidable. For sensitive semiconductor components, however, this amount can already be critical, so that special passivation treatments, varnish coatings or drying means become necessary. This further increases the costs for the case.

It is accordingly an object of the invention to provide a case for a semiconductor component which overcomes the hereinaforementioned disadvantage of the heretofore-known devices of this general type, and to do so in such a manner that the maximum value of the permissible moisture is not exceeded.

With the foregoing and other objects in view there is provided, in accordance with the invention, a case for a semiconductor component, comprising at least two parts, one of the parts being a cap, at least the cap being formed of a material having a low hydrogen permeability and a weak catalytic effect for an oxyhydrogen gas reaction.

In accordance with another feature of the invention, another of the parts is a plate disposed beneath the cap.

However, a material with working properties similar to nickel (deformation, hardness, weldability, electroplatability) is preferably used where considerably lower hydrogen permeability is desired. Therefrom, in accordance with a further feature of the invention, the material is an alloy of copper, nickel and zinc(German silver with 55 to 60% Cu, 12 to 26% Ni and 19 to 31% zinc) which exhibits these properties: The production of moisture can be reduced in a case comprising German silver to noncritical values.

In accordance with an added feature of the invention, the material is chosen from the group consisting of copper, brass, silver, and aluminum.

In accordance with a concomitant feature of the invention, the material is nickel, and the parts have inner surfaces, and there is provided a plating formed of a material chosen from the group consisting of gold, silver, and copper disposed on the inner surfaces.

Therefore, if for certain reasons nickel caps are to be used, such a coating or plating on the inside surface already brings about considerable improvements by eliminating the catalytic effect of nickel. However, the diffusion of hydrogen can only be reduced thereby, but not prevented. Uninhibited diffusion and local catalysis can also take place due to disturbances in the coating (for instance at a welded seam).

Other features which are considered as characteristic for the invention are set forth in the appended claims.

Although the invention is illustrated and described herein as embodied in a case for a semiconductor component, it is nevertheless not intended to be limited to the details shown, since various modifications and structural changes may be made therein without departing from the spirit of the invention and within the scope and range of equivalents of the claims.

Figure 2:
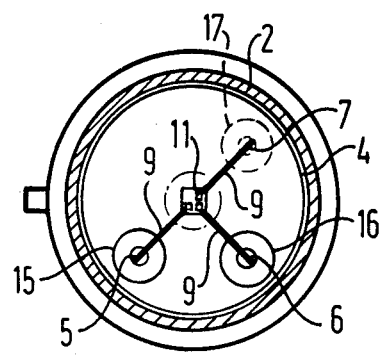

The construction and method of operation of the invention, however, together with additional objects and advantages thereof will be best understood from the following description of specific embodiments when read in connection with the accompanying drawings, in which:

FIG. 1 is a fragmentary diagrammatic cross-sectional view of the case of the invention; and FIG. 2 is a cross-sectional view of FIG. 1, taken along the line II—II thereof, in the direction of the arrows.

Referring now to the figures of the invention as a whole, there is seen a cap 2 which is formed of an alloy of copper, nickel and zinc, i.e., German silver, and is welded to a bottom plate 1 of an iron-nickel-cobalt alloy by a weld 3. The cap 2 may also be formed of copper, brass, silver or aluminum. Furthermore, the cap may be made of nickel, in which case the inner surface thereof may be plated with a gold, silver or copper layer 10. The bottom plate 1 has a pedestal 4 of the same material as the bottom plate 1. Three lead-ins 5,6,7 are brought through the bottom plate 1 and the pedestal 4; they are insulated from the bottom plate 1 and the pedestal or raised portion 4 by glass beads 15, 16, 17. On the pedestal 4 there is disposed a semiconductor component such as a transistor 8. The contacts 11 of the transistor 8 are connected to the leads, 5, 6 and 7 through gold wires 9. The bottom plate 1 and the pedestal 4 can, of course, also be formed of the same material as the cap 2.

We claim:

1. Case for a semiconductor component, comprising at least two parts, one of said parts being a cap, at least said cap being formed of a material having a low hydrogen permeability and a weak catalytic effect for an oxyhydrogen gas reaction, said material being an alloy of copper, nickel and zinc.

2. Case according to claim 1, wherein another of said parts is a plate disposed beneath said cap.

* * * * *